United States Patent
Ozaki et al.

(10) Patent No.: US 11,264,491 B2
(45) Date of Patent: Mar. 1, 2022

(54) SEMICONDUCTOR DEVICE FOR IMPROVING TRANSISTOR CHARACTERISTICS DURING TURN-ON

(71) Applicant: FUJI ELECTRIC CO., LTD., Kanagawa (JP)

(72) Inventors: Daisuke Ozaki, Okaya (JP); Akinori Kanetake, Matsumoto (JP); Tohru Shirakawa, Matsumoto (JP); Yosuke Sakurai, Azumino (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 0 days.

(21) Appl. No.: 16/940,407

(22) Filed: Jul. 28, 2020

(65) Prior Publication Data

US 2020/0357904 A1    Nov. 12, 2020

Related U.S. Application Data

(63) Continuation of application No. PCT/JP2019/026181, filed on Jul. 1, 2019.

(30) Foreign Application Priority Data

Aug. 10, 2018  (JP) .............................. JP2018-151662

(51) Int. Cl.
*H01L 29/739*    (2006.01)
*H01L 29/861*    (2006.01)
(Continued)

(52) U.S. Cl.
CPC ...... *H01L 29/7397* (2013.01); *H01L 27/0761* (2013.01); *H01L 29/872* (2013.01)

(58) Field of Classification Search
CPC ............. H01L 29/7397; H01L 29/8613; H01L 29/4238; H01L 29/0696; H01L 29/407;
(Continued)

(56) References Cited

U.S. PATENT DOCUMENTS 8,872,257 B1 * 10/2014 Matsuoka ........... H01L 29/7397
                                                           257/328
9,847,409 B2 * 12/2017 Shiga .................. H01L 23/4824
(Continued)

FOREIGN PATENT DOCUMENTS

JP    2005294649 A    10/2005
JP    2016174029 A     9/2016
(Continued)

OTHER PUBLICATIONS

International Search Report and (ISA/237) Written Opinion of the International Search Authority for International Patent Application No. PCT/JP2019/026181, mailed by the Japan Patent Office dated Sep. 17, 2019.

*Primary Examiner* — Shahed Ahmed
*Assistant Examiner* — Khatib A Rahman

(57) ABSTRACT

Provided is a semiconductor device including a semiconductor substrate provided with a transistor portion, wherein the semiconductor substrate includes, in the transistor portion, a drift region of a first conductivity type; an accumulation region of the first conductivity type that has a higher doping concentration than the drift region; a collector region of a second conductivity type; and a plurality of gate trench portions and a plurality of dummy trench portions that are provided extending in a predetermined extension direction in the top surface of the semiconductor substrate, and are arranged in an arrangement direction orthogonal to the extension direction, and the transistor portion includes a first region that includes a gate trench portion; and a second region in which the number of dummy trench portions arranged in a unit length in the arrangement direction is greater than in the first region.

15 Claims, 18 Drawing Sheets

(51) Int. Cl.
*H01L 27/07* (2006.01)
*H01L 29/872* (2006.01)

(58) Field of Classification Search
CPC . H01L 27/06; H01L 21/8234; H01L 27/0761; H01L 29/872
See application file for complete search history.

(56) References Cited

U.S. PATENT DOCUMENTS

| | | | |
|---|---|---|---|
| 2003/0047778 A1 | 3/2003 | Nakamura | |
| 2011/0193132 A1* | 8/2011 | Kouno | H01L 29/0696 257/139 |
| 2013/0037853 A1* | 2/2013 | Onozawa | H01L 29/0839 257/139 |
| 2014/0124831 A1* | 5/2014 | Rahimo | H01L 29/0696 257/139 |
| 2016/0336404 A1* | 11/2016 | Naito | H01L 29/42368 |
| 2017/0018636 A1* | 1/2017 | Naito | H01L 29/0649 |
| 2017/0025522 A1* | 1/2017 | Naito | H01L 29/407 |
| 2017/0170273 A1* | 6/2017 | Naito | H01L 29/407 |
| 2017/0317175 A1* | 11/2017 | Naito | H01L 29/0696 |
| 2018/0204909 A1* | 7/2018 | Konishi | H01L 29/1095 |
| 2020/0091328 A1* | 3/2020 | Ngwendson | H01L 29/0696 |

FOREIGN PATENT DOCUMENTS

| | | |
|---|---|---|
| JP | 2017147431 A | 8/2017 |
| WO | 32061845 A1 | 8/2002 |
| WO | 2011111500 A1 | 9/2011 |
| WO | 2017033315 A1 | 3/2017 |

\* cited by examiner

SEMICONDUCTOR DEVICE FOR IMPROVING TRANSISTOR CHARACTERISTICS DURING TURN-ON

The contents of the following Japanese patent applications are incorporated herein by reference:
NO. 2018-151662 filed in JP on Aug. 10, 2018, and
NO. PCT/JP2019/026181 filed on Jul. 1, 2019.

BACKGROUND

1. Technical Field

The present invention relates to a semiconductor device.

2. Related Art

A conventional configuration is known in which, in a semiconductor device such as an insulated gate bipolar transistor (IGBT), an N type impurity region (accumulation region) with a relatively high concentration of N type impurities is provided in the vicinity of a PN junction between a P type base region and an N type drift region, as shown in Patent Document 1, for example
Patent Document 1: WO 2002/061845

When an accumulation region is provided in a semiconductor device, the accumulation region becomes a barrier and accumulates holes. Therefore, the gate is charged when the semiconductor device is turned ON, and there are cases where the control over a semiconductor device that is turned ON is worsened.

SUMMARY

In order to solve the above problem, according to one aspect of the present invention, provided is a semiconductor device comprising a semiconductor substrate provided with a transistor portion. The semiconductor substrate may include, in the transistor portion, a drift region of a first conductivity type. The semiconductor substrate may include, in the transistor portion, an accumulation region of the first conductivity type that is provided between the drift region and a top surface of the semiconductor substrate and has a higher doping concentration than the drift region. The semiconductor substrate may include, in the transistor portion, a collector region of a second conductivity type that is provided between a bottom surface of the semiconductor substrate and the drift region. The semiconductor substrate may include, in the transistor portion, a plurality of gate trench portions and a plurality of dummy trench portions that are provided from the top surface of the semiconductor substrate to a position deeper than the accumulation region, the plurality of gate trench portions and the plurality of dummy trench portions extending in a predetermined extension direction in the top surface of the semiconductor substrate and arranged in an arrangement direction orthogonal to the extension direction. The transistor portion may include a first region that includes a gate trench portion, and a second region in which the number of dummy trench portions arranged in a unit length in the arrangement direction is greater than in the first region.

The second region may be arranged in a center of the transistor portion in the arrangement direction.

The first region may include a plurality of gate trench portions, each gate trench portion being the gate trench portion, arranged continuously in the arrangement direction, but does not need to include the dummy trench portion.

The second region may include both the dummy trench portion and the gate trench portion.

The first region and the second region may be arranged side by side in the arrangement direction.

The first region and the second region may be arranged side by side in the extension direction.

The semiconductor substrate may be further provided with a diode portion. A plurality of transistor portions, each transistor portion being the transistor portion, and a plurality of diode portions, each diode portion being the diode portion, may be arranged in an alternating manner in the arrangement direction. It is acceptable for at least one of the transistor portions to not be sandwiched by the diode portions in the arrangement direction. At least one of the transistor portions may be sandwiched by the diode portions in the arrangement direction. The second region of the transistor portion that is not sandwiched by the diode portions may have a greater width in the arrangement direction than the second region of the transistor portion that is sandwiched by the diode portions.

In the transistor portions, regions where a distance from the diode portions in the arrangement direction is greater may have a higher ratio of the number of dummy trench portions to the number of gate trench portions.

The second region may be arranged sandwiched by first regions, each first region being the first region, in both the extension direction and the arrangement direction.

The first region may be arranged sandwiched by second regions, each second region being the second region, in both the extension direction and the arrangement direction.

The summary clause does not necessarily describe all necessary features of the embodiments of the present invention. The present invention may also be a sub-combination of the features described above.

BRIEF DESCRIPTION OF THE DRAWINGS

FIG. 5 is a schematic view of an example of a hole concentration distribution in a region below the accumulation region 16 when the transistor portion 70 is turned ON.

DESCRIPTION OF EXEMPLARY EMBODIMENTS

Hereinafter, some embodiments of the present invention will be described, but the embodiments do not limit the invention according to the claims. Furthermore, all the combinations of the features described in the embodiments are not necessarily essential to means provided by aspects of the invention.

In this Specification, one side of the semiconductor substrate in a direction parallel to a depth direction is referred to as the "top" and the other side is referred to as the "bottom". Among the two surfaces of each substrate, layer, and other components, one surface is referred to as the "top surface" and the other surface is referred to as the "bottom surface." The directions of the "top" and "bottom" are not limited to the direction of gravity or to the directions when the semiconductor device is implemented.

In each embodiment, an example is described in which a first conductivity type is N type and a second conductivity type is P type, but instead a first conductivity type may be P type and a second conductivity type may be N type. In this case, the conductivity type of each substrate, layer, region, and the like in each embodiment may have the opposite polarity. Furthermore, when P+ type (or N+ type) is used in this specification, this means that the doping concentration is higher than when P type (or N type) is used, and when P− type (or N− type) is used, this means that the doping concentration is lower than when P type (or N type) is used.

In this specification, the doping concentration refers to the concentration of impurities that have become donors or acceptors. In this Specification, the difference between the concentration of the donors and the concentration of the acceptors (that is, the net doping concentration), may be referred to as the doping concentration. In this case, the doping concentration can be measured using the SR technique. Furthermore, the chemical concentration of the donors and acceptors may be the doping concentration. In this case, the doping concentration can be measured using the SIMS technique. If not particularly limited, either of the above may be used as the doping concentration. If not particularly limited, the peak value of a doping concentration distribution in a doping region may be the doping concentration in this doping region.

Figure 1:
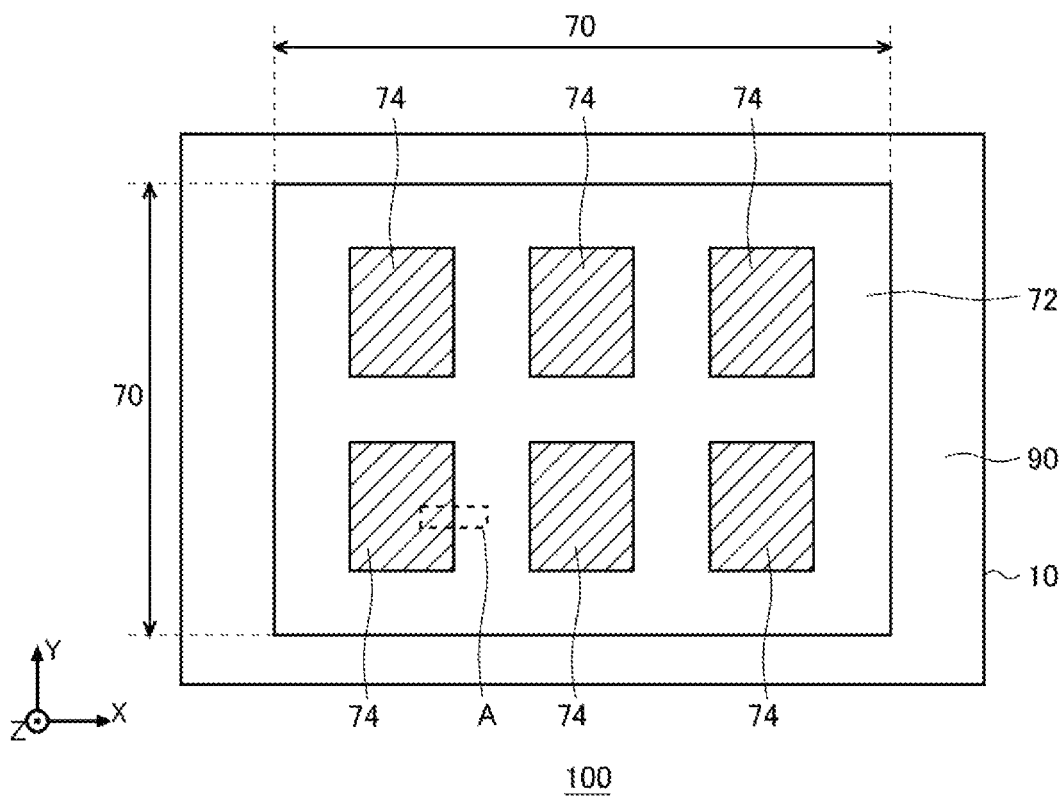
FIG. 1 is a top surface view of an example of a semiconductor device 100 according to one embodiment of the present invention.

FIG. 1 is a top surface view of an example of a semiconductor device 100 according to one embodiment of the present invention. The semiconductor device 100 includes a semiconductor substrate 10. The semiconductor substrate 10 may be a silicon substrate, a silicon carbide substrate, or a nitride semiconductor substrate made of a gallium nitride or the like. The semiconductor substrate 10 of the present example is a silicon substrate. In this Specification, an end portion of an outer periphery of the semiconductor substrate 10 in the top surface view is an outer peripheral end. The top surface view refers to viewing in a direction parallel to the Z-axis from the top surface side of the semiconductor substrate 10.

The semiconductor device 100 includes a transistor portion 70 and an edge region 90. The transistor portion 70 is a region in which a transistor element such as an IGBT is provided. The transistor portion 70 of the present example is a vertical element in which a main current flows between the top surface and the bottom surface of the semiconductor substrate 10, when the transistor element is controlled to be in the ON state.

The edge region 90 is provided between the transistor portion 70 and the outer peripheral end of the semiconductor substrate 10, on the top surface of the semiconductor substrate 10. The edge region 90 may be arranged in an annular shape surrounding the transistor portion 70 on the top surface of the semiconductor substrate 10. The edge region 90 of the present example is arranged along the outer peripheral end of the semiconductor substrate 10. The edge region 90 may relax the electric field concentration on the top surface side of the semiconductor substrate 10. The edge region includes a guard ring, a field plate, a RESURF, and a structure formed by a combination of these components, for example Pads such as a gate pad and an emitter pad are provided on the top surface of the semiconductor substrate 10, but these pads are omitted from FIG. 1. Furthermore, a gate wire (gate runner) connected to the gate pad and an emitter electrode connected to the emitter pad are provided on the top surface of the semiconductor substrate 10, but these components are omitted from FIG. 1. The emitter electrode does not need to be provided above the edge region 90.

As an example, the gate wire includes a portion provided surrounding the transistor portion 70 in the top surface view of the semiconductor substrate 10. Furthermore, the gate wire may include a portion provided crossing the transistor portion 70 in the top surface view of the semiconductor substrate 10. The emitter electrode may be provided covering the top of the transistor portion 70.

A gate trench portion connected to the gate line and a dummy trench portion connected to the emitter electrode are provided in the top surface of the semiconductor substrate 10. Each trench portion is provided from the top surface of the semiconductor substrate 10 to a prescribed depth in the semiconductor substrate 10.

The transistor portion 70 includes a first region 72 and a second region 74. At least the gate trench portion is provided in the first region 72. At least the dummy trench portion is provided in the second region 74. The second region 74 may be a region in which the density of dummy trench portions provided per unit area is greater than in the first region 72. The semiconductor device 100 includes the second region in which a large number of dummy trench portions are provided, and therefore extraction of the generated holes to the emitter electrode side becomes easier when the transistor portion 70 is turned ON or the like. Therefore, the controllability of the transistor portion 70 is improved. The extraction of the holes is described further below.

Figure 2:
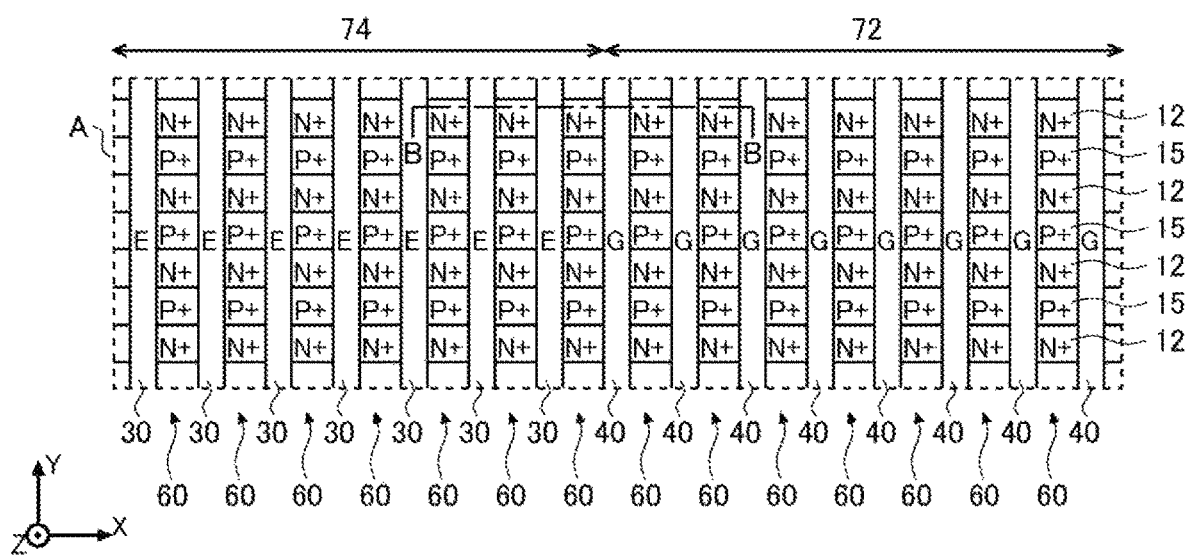
FIG. 2 is a top surface view in which the region A of FIG. 1 has been enlarged.

FIG. 2 is a top surface view in which the region A of FIG. 1 has been enlarged. The region A includes the first region 72 and the second region 74. In the transistor portion 70, a plurality of gate trench portions 40 and a plurality of dummy trench portions 30 are provided extending in a predetermined extension direction in the top surface of the semiconductor substrate 10. In the drawings of the present application, gate trench portions 40 may be labeled with the letter "G" and dummy trench portions 30 may be labeled with the letter "E". The gate trench portions 40 and dummy trench portions 30 of the present example have linear portions that extend in the extension direction. In this Specification, the extension direction is the Y-axis direction. In this Specification, the gate trench portions 40 and dummy trench portions 30 may be referred to as trench portions.

The trench portions are arranged in an arrangement direction that is orthogonal to the extension direction. Essentially, the trench portions are arranged at prescribed intervals in the arrangement direction. These intervals may or may not be constant. In this Specification, the arrangement direction is the X-axis direction.

In this Specification, a portion of the semiconductor substrate 10 sandwiched by two trench portions in the X-axis direction is referred to as a mesa portion 60. A mesa portion 60 is arranged between each set of trench portions. An emitter region 12 of a first conductivity type exposed on the top surface of the semiconductor substrate 10 may be provided in each mesa portion 60. The emitter region 12 of the present example is N+ type. The emitter region 12 is provided in contact with a trench portion. The emitter region 12 of the present example contacts both of the two trench portions that are on respective sides of the mesa portion 60.

A contact region 15 of a second conductivity type exposed on the top surface of the semiconductor substrate 10 may be provided in each mesa portion 60. The contact region 15 of the present example is P+ type. The contact region 15 may be provided in contact with a trench portion, or may be provided at a distance from the trench portion. The contact region 15 of the present example contacts both of the two trench portions that are on respective sides of the mesa portion 60. Emitter regions 12 and contact regions 15 may be arranged in an alternating manner along the Y-axis direction in each mesa portion 60.

As described above, the first region 72 includes the gate trench portions 40. In the example of FIG. 2, the gate trench portions 40 are arranged continuously in the X-axis direction in the first region 72, but the dummy trench portions 30 are not arranged in the first region 72. However, dummy trench portions 30 may be arranged in the first region 72.

As described above, the second region 74 includes a higher density of dummy trench portions 30 than the first region 72. In other words, the number of dummy trench portions 30 arranged within a unit length in the X-axis direction in the second region 74 is greater than the number of dummy trench portions 30 arranged within a unit length in the X-axis direction in the first region 72. In the example shown in FIG. 2, the dummy trench portions 30 are arranged continuously in the X-axis direction in the second region 74, but gate trench portions 40 are not arranged in the second region 74. However, both dummy trench portions 30 and gate trench portions 40 may be arranged in the second region 74.

Mesa portions 60 that are in contact with a gate trench portion 40 and mesa portions 60 that are not in contact with a gate trench portion 40 (i.e. mesa portions 60 sandwiched between dummy trench portions 30) may have different structures for the doping regions such as the emitter regions 12. For example, a mesa portion 60 sandwiched between dummy trench portions 30 does not need to be provided with an emitter region 12. A mesa portion 60 sandwiched between dummy trench portions 30 may be provided with a P type region instead of the emitter region 12. The area of a P type region (including P+ and P− type regions) exposed on the top surface of a mesa portion 60 sandwiched between dummy trench portions 30 may be greater than the area of a P type region (including P+ and P− type regions) exposed on the top surface of a mesa portion 60 that is in contact with a gate trench portion 40.

Figure 3:
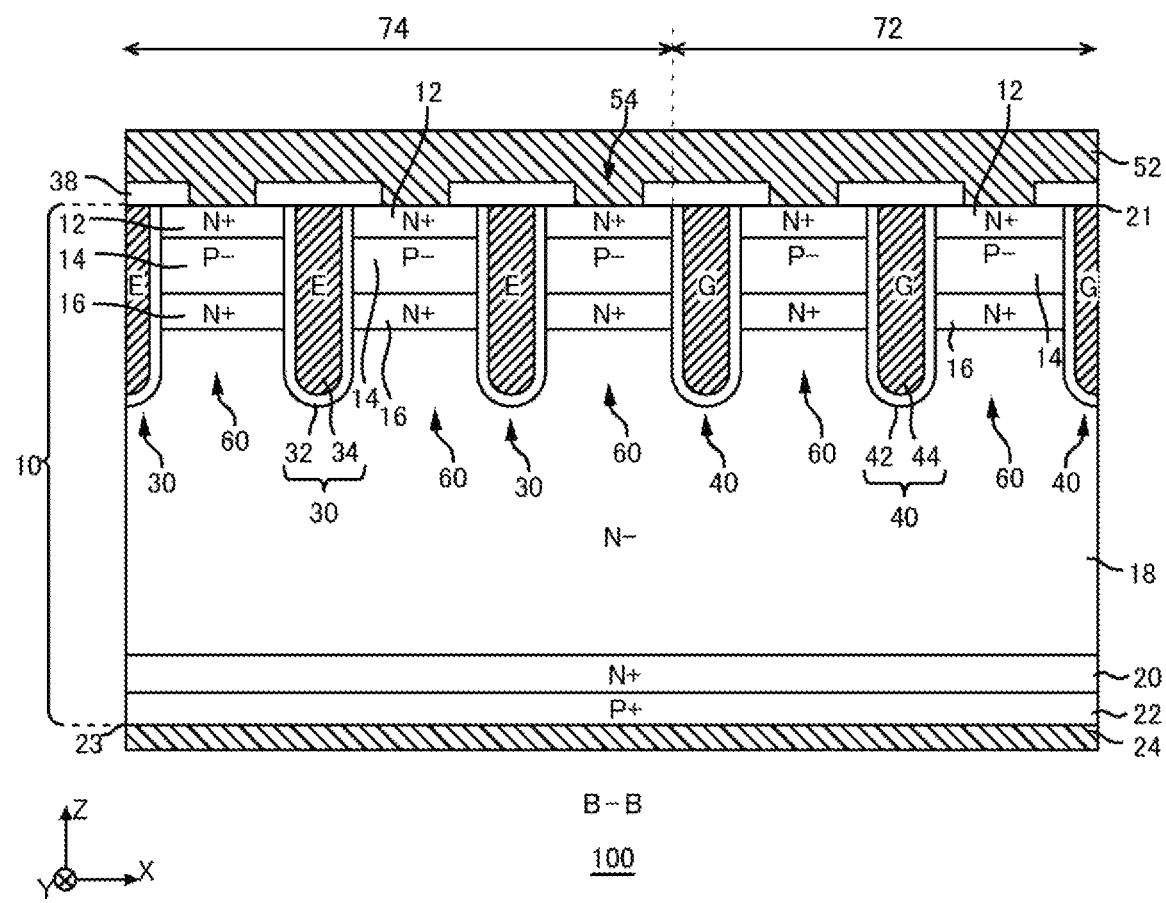
FIG. 3 shows an example of a B-B cross section in FIG. 2.

FIG. 3 shows an example of a B-B cross section in FIG. 2. The B-B cross section of the present example is a cross section in the XZ-plane spanning the first region 72 and the second region 74, and passes through the emitter region 12. The semiconductor device 100 of the present example includes the semiconductor substrate 10, an interlayer dielectric film 38, an emitter electrode 52, and a collector electrode 24 in this cross section. The interlayer dielectric film 38 is silicate glass to which impurities such as boron and phosphorous have been added, for example. The interlayer dielectric film 38 is formed selectively on a top surface 21 of the semiconductor substrate 10. The emitter electrode 52 is provided on the top surfaces of the semiconductor substrate 10 and the interlayer dielectric film 38. The collector electrode 24 is provided on a bottom surface 23 of the semiconductor substrate 10.

An N− type drift region 18 is provided in the semiconductor substrate 10. The drift region 18 of the present example is a remaining region in the semiconductor substrate 10 where the doping regions such as the emitter region 12, a base region 14, an accumulation region 16, a buffer region 20, and a collector region 22 are not formed.

The P− type base region 14 is provided between the top surface 21 of the semiconductor substrate 10 and the drift region 18. The base region 14 may be formed by implanting P type impurities such as boron through the top surface 21 of the semiconductor substrate 10.

The N+ type emitter region 12 is provided above the base region 14. The emitter region 12 may be formed by implanting N type impurities such as phosphorous through the top surface 21 of the semiconductor substrate 10. It should be noted that, in the XZ cross section passing through the contact region 15 in FIG. 2, the contact region 15 may be arranged instead of the emitter region 12 shown in FIG. 3. The emitter region 12 and the contact region 15 are connected to the emitter electrode 52, via contact holes 54 provided in the interlayer dielectric film 38.

The accumulation region 16 is provided between the drift region 18 and the top surface 21 of the semiconductor substrate 10. The accumulation region 16 of the present example is provided between the drift region 18 and the base region 14. The accumulation region 16 may be formed by implanting N type impurities such as phosphorous or protons through the top surface 21 of the semiconductor substrate 10. The accumulation region 16 is N+ type, and has a higher doping concentration than the drift region 18.

By providing the accumulation region 16, it is possible to suppress the extraction of holes from the drift region 18 to the base region 14. Therefore, holes can be accumulated in the drift region 18 and the ON voltage of the transistor portion 70 can be reduced.

In the present example, the gate trench portions 40 and the dummy trench portions 30 are provided penetrating through the emitter region 12, the base region 14, and the accumulation region 16 from the top surface 21 of the semiconductor substrate 10. In other words, the trench portions are provided from the top surface 21 of the semiconductor substrate 10 to a position deeper than the accumulation region 16.

The floor portions of the gate trench portions 40 and the dummy trench portions 30 of the present example are arranged within the drift region 18. Here, having the trench portions penetrate through each region is not limited to a structure manufactured by forming the trench layers after the doping with impurities is performed to form each region, in this order. Having the trench portions penetrate through each region also includes a structure in which each region is formed between the trench portions after the trench portions have been formed.

The buffer region 20 is provided on the bottom surface side of the drift region 18. The doping concentration of the buffer region 20 is higher than the doping concentration of the drift region 18. The buffer region 20 functions as a field stop layer that prevents a depletion layer expanding from the bottom surface side of the base region 14 from reaching the P+ type collector region 22.

The collector region 22 is provided between the bottom surface 23 of the semiconductor substrate 10 and the drift region 18. The collector region 22 of the present example is provided on the bottom surface side of the buffer region 20. The collector region 22 is P+ type, and has a higher doping concentration than the base region 14.

As shown in FIGS. 2 and 3, the transistor portion 70 may refer to a region in which the collector region 22 is provided on the bottom surface 23 of the semiconductor substrate 10 and trench portions are arranged in the X-axis direction in the top surface 21 of the semiconductor substrate 10. The intervals of the trench portions in the transistor portion 70 may or may not be constant.

The gate trench portion 40 includes a gate insulating film 42 and a gate conducting portion 44. The gate insulating film 42 is provided covering an inner wall of the gate trench. The gate insulating film 42 may be formed by oxidizing or nitriding a semiconductor of the inner wall of the gate trench. The gate conducting portion 44 is covered by the gate insulating film 42 within the gate trench. In other words, the gate insulating film 42 provides insulation between the gate conducting portion 44 and the semiconductor substrate 10. The gate conducting portion 44 is formed of a conductive material such as polysilicon.

The gate conducting portion 44 includes a region that is opposite at least the base region 14 adjacent thereto in the depth direction. The gate trench portion 40 in this cross section is covered by the interlayer dielectric film 38 on the top surface 21 of the semiconductor substrate 10. When a prescribed voltage is applied to the gate conducting portion 44, a channel is formed in a surface layer of the interface that is in contact with the gate trench portion 40, among the base region 14.

The dummy trench portion 30 of the present example includes a dummy insulating film 32 and a dummy conducting portion 34. The dummy insulating film 32 is provided covering the inner wall of the dummy trench. The dummy conducting portion 34 is provided inside the dummy trench portion 30 and is covered by the dummy insulating film 32. The dummy insulating film 32 provides insulation between the dummy conducting portion 34 and the semiconductor substrate 10. The dummy conducting portion 34 may be formed of the same material as the gate conducting portion 44. For example, the dummy conducting portion 34 is formed of a conductive material such as polysilicon. The dummy conducting portion 34 may have the same length as the gate conducting portion 44 in the depth direction. In this cross section, the dummy trench portion 30 is covered by the interlayer dielectric film 38 on the top surface 21 of the semiconductor substrate 10.

The dummy conducting portion 34 is electrically connected to the emitter electrode 52. For example, a contact hole electrically connecting the dummy conducting portion 34 and the emitter electrode 52 is provided in a partial region of the interlayer dielectric film 38 covering the dummy trench portion 30.

Figure 4:
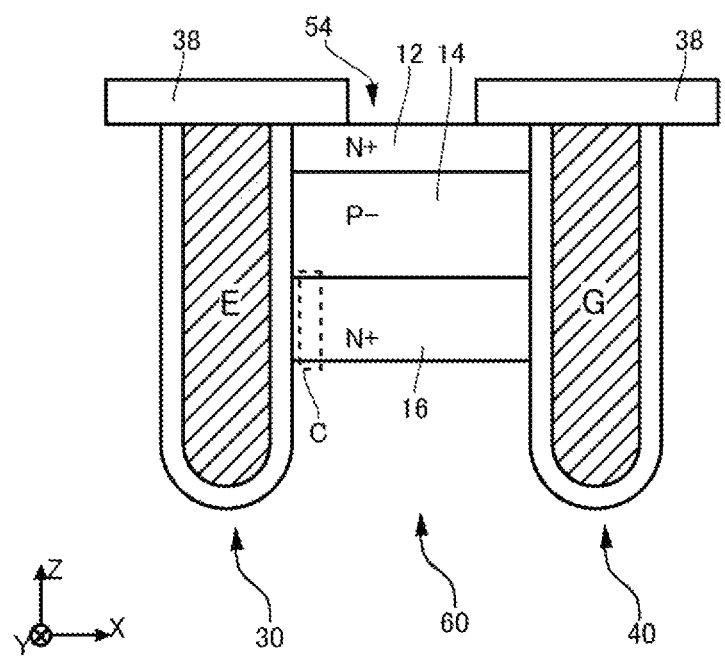
FIG. 4 is an enlarged view of a mesa portion 60 sandwiched between a gate trench portion 40 and a dummy trench portion 30.

FIG. 4 is an enlarged view of a mesa portion 60 sandwiched between a gate trench portion 40 and a dummy trench portion 30. By providing the accumulation region 16 in the mesa portion 60, the accumulation region 16 becomes a barrier to holes. Therefore, when the transistor portion 70 is turned ON or the like, some of the holes implanted in the drift region 18 from the collector region 22 are accumulated below the accumulation region 16. In particular, the density of holes becomes high on the gate trench portion 40 side. For example, compared to a case where the accumulation region 16 is not provided in the transistor portion 70 of a full gate structure, providing the accumulation region 16 in the transistor portion 70 of the full gate structure can increase the hole density in the vicinity of the bottom end of the gate trench portion 40 by approximately 10 times.

Therefore, in the case of the transistor portion 70 of the full gate structure, the gate trench portion 40 is charged by the holes in the vicinity of the trench portions and, when the transistor portion 70 is turned ON, the gate voltage at the gate conducting portion 44 is lifted up. As a result, the slope (di/dt) of a time waveform of the emitter/collector current when the transistor portion 70 is turned ON becomes high, which may cause the noise tolerance to become low. There is a desire to reduce this di/dt using an external drive resistance electrically connected to the gate conducting portion 44, but since the lifting up of the gate voltage cannot be suppressed, it is impossible to lower di/dt. Furthermore, the time waveform of the emitter/collector current may oscillate when the emitter/collector current increases and flows in an amount beyond a prescribed value due to di/dt becoming high when the transistor portion 70 is turned ON.

In contrast to this, on the dummy trench portion 30 side, extraction of the holes accumulated below the accumulation region 16 becomes easier when the transistor portion 70 is turned ON. For example, when the transistor portion 70 is turned ON, a positive gate voltage is applied to the gate conducting portion 44 while the dummy conducting portion 34 is kept at an emitter potential. As a result, it becomes easy for the holes that have a positive charge to gather in the vicinity of the dummy trench portion 30 when the transistor portion 70 is turned ON. When holes gather in the vicinity of the dummy trench portion 30, the accumulation region 16 in a region C in the vicinity of the dummy trench portion 30 is inverted to P type. Therefore, it becomes easy for the holes to be extracted to the base region 14 through the region C that has been inverted to P type. The holes that have reached the base region 14 are extracted to the emitter electrode 52 through the contact region 15 shown in FIG. 2. Therefore, by providing the dummy trench portion 30, it is possible to reduce the hole density when the transistor portion 70 is turned ON.

The extraction of holes via the dummy trench portion 30 is not limited to the holes of the mesa portion 60 sandwiched between this dummy trench portion 30 and a gate trench portion 40. Holes of a mesa portion 60 distanced from a dummy trench portion 30 can also be extracted via this dummy trench portion 30. However, the amount of holes extracted becomes lower farther from the dummy trench portion 30. Furthermore, the amount of holes extracted becomes greater as the number of dummy trench portions 30 becomes larger.

As described above, more gate trench portions 40 are arranged in the first region 72 than in the second region 74. For example, the first region 72 is a full gate structure in which gate trench portions 40 are provided but dummy trench portions 30 are not provided. By providing many gate trench portions 40, it is possible to improve the carrier accumulation effect and the channel density, and therefore the ON voltage can be reduced.

A greater number of dummy trench portions 30 are arranged in the second region 74 than in the first region 72. For example, the number of dummy trench portions 30 arranged per unit length in the X-axis direction in the second region 74 is greater than or equal to two times the number of dummy trench portions 30 arranged per unit length in the X-axis direction in the first region 72. The number of dummy trench portions 30 arranged in the X-axis direction in the second region 74 may be greater than the number of gate trench portions 40 arranged in the X-axis direction in the second region 74. By providing the second region 74, it is possible to reduce the hole density below the accumulation region 16 in the first region 72 when the transistor portion 70 is turned ON.

That is, by providing the first region 72 and the second region 74, it is possible to improve the carrier accumulation effect and the channel density while also improving the characteristics of the transistor portion 70 when turned ON. As shown in FIG. 1, the first region 72 and the second region 74 may be arranged in an alternating manner in the X-axis direction. In other words, at least one first region 72 may be sandwiched between second regions 74 in the X-axis direction. Furthermore, at least one second region 74 may be sandwiched by first regions 72 in the X-axis direction.

In the first region 72, it becomes easier for the holes to be extracted via the second region 74 in regions closer to the second region 74. Therefore, by arranging the first regions 72 and the second regions 74 in an alternating manner, extraction of the holes in all of the first regions 72 through the second regions 74 becomes easier.

Furthermore, as shown in FIG. 1, the first regions 72 and the second regions 74 may be arranged in an alternating manner in the Y-axis direction. At least one first region 72 may be sandwiched between second regions 74 in the Y-axis direction. Furthermore, at least one second region 74 may be sandwiched between first regions 72 in the Y-axis direction. With such a configuration, in the Y-axis direction as well, extraction of the holes of the first regions 72 via the second regions 74 becomes easier.

A first region 72 may be arranged sandwiched between second regions 74 in both the X-axis direction and the Y-axis direction. Furthermore, a second region 74 may be arranged sandwiched between first regions 72 in both the X-axis direction and the Y-axis direction. As shown in FIG. 1, a plurality of second regions 74 may be arranged at uniform intervals in the X-axis direction. Furthermore, a plurality of second regions 74 may be arranged at uniform intervals in the Y-axis direction. The first regions 72 may be arranged between the second regions 74. Furthermore, a first region 72 may also be arranged between an end portion of the transistor portion 70 and a second region 74. In such a case, the second region 74 is surrounded by the first regions 72 in the top surface view. With such a configuration as well, extraction of the holes of the first regions 72 via the second regions 74 becomes easier.

Each second region 74 includes a plurality of trench portions in the X-axis direction. The number of trench portions included in a first region 72 and in a second region 74 that are adjacent in the X-axis direction may be the same, the number of trench portions in the first region 72 may be greater, or the number of trench portions in the second region 74 may be greater.

Figure 5:
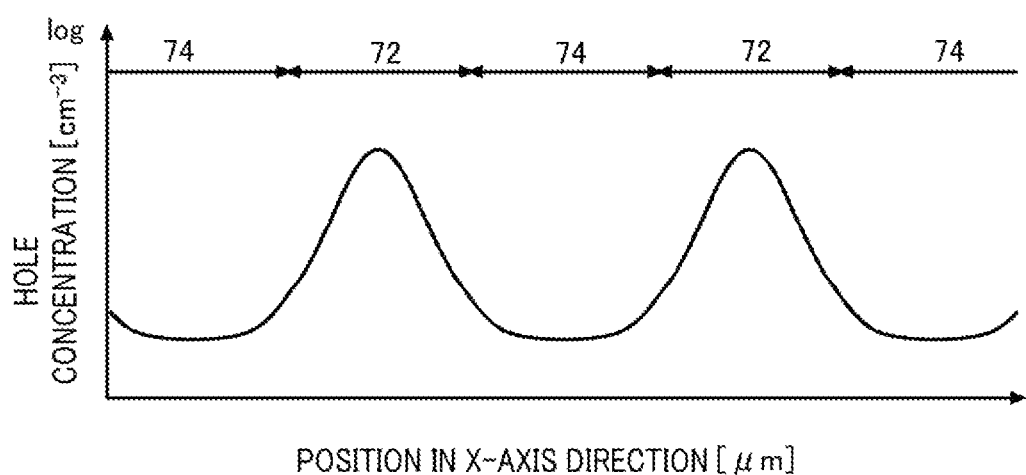

FIG. 5 is a schematic view of an example of a hole concentration distribution in a region below the accumulation region 16 when the transistor portion 70 is turned ON. FIG. 5 shows the hole concentration distribution in the X-axis direction, in first regions 72 and second regions 74. In FIG. 5, the vertical axis is an axis indicating the hole concentration [cm$^{-3}$] in a logarithmic scale, and the horizontal axis is an axis indicating the position in the X-axis direction [μm].

Figure 6:
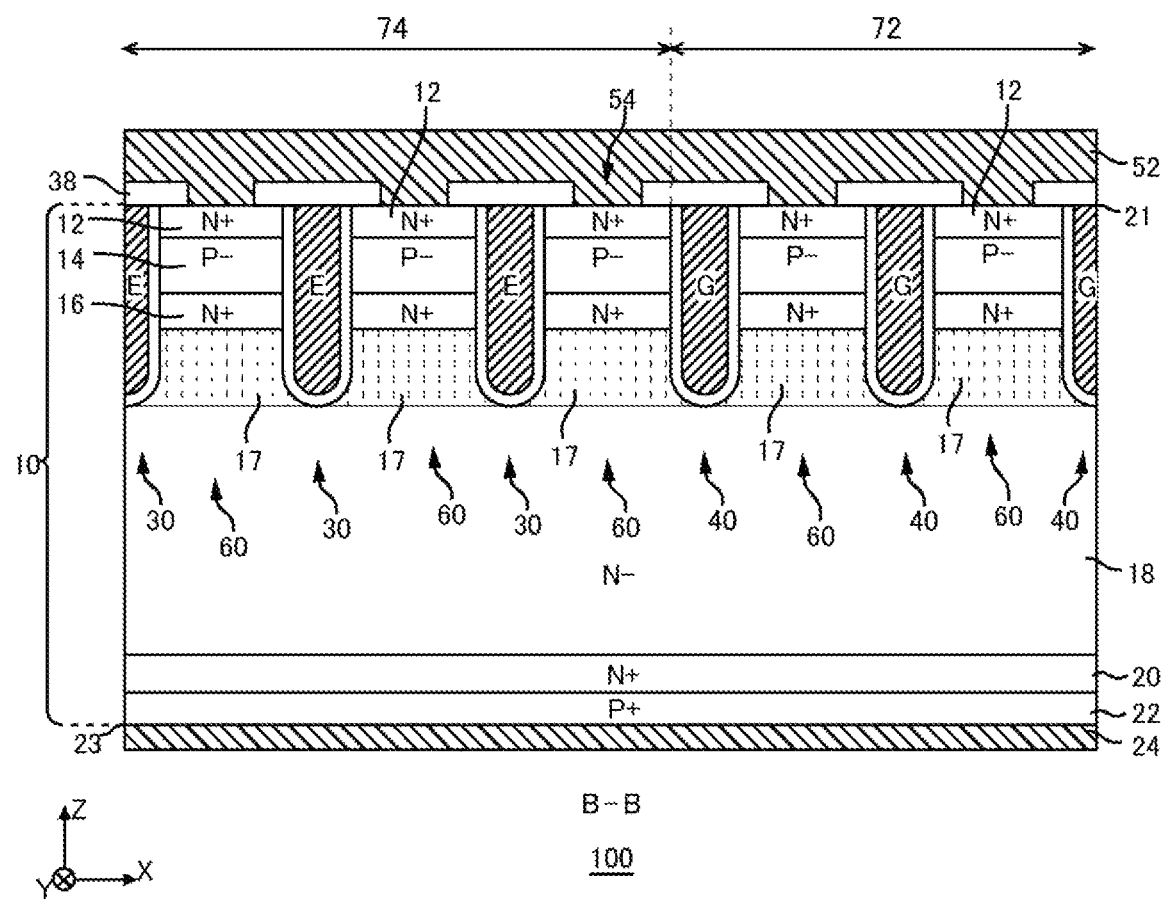
FIG. 6 shows an under region 17 of the accumulation region 16.

FIG. 6 shows an under region 17 of the accumulation region 16. The under region 17 of the present example is a region that is below the accumulation region 16 and above the bottom ends of the trench portions, in a mesa portion 60 sandwiched by trenches. FIG. 5 shows an outline of the hole concentration at a prescribed depth position in the under region 17. As shown in FIG. 5, the hole concentration in the second regions 74 becomes low. Furthermore, the hole concentration in the first regions 72 also becomes low in the vicinity of the second regions 74, and becomes higher farther from the second regions 74.

Figure 7:
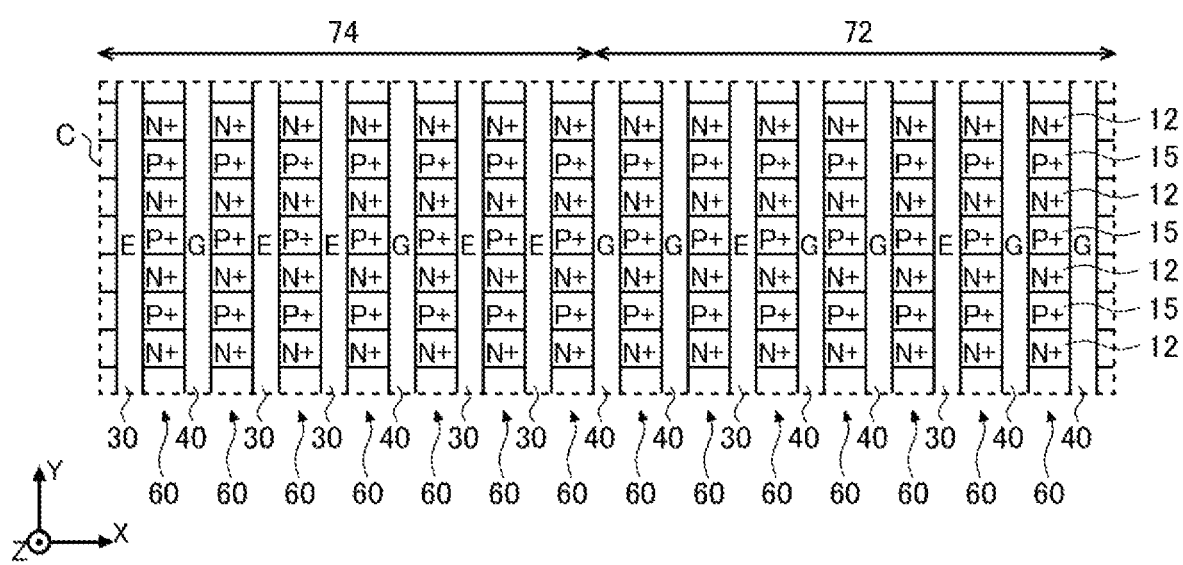
FIG. 7 is a top surface view of another example of the region A in FIG. 1.

FIG. 7 is a top surface view of another example of the region A in FIG. 1. The region A of the present example differs from the example shown in FIG. 2 with regard to the arrangement of the trench portions in the second region 74. The second region 74 of the present example includes dummy trench portions 30 and gate trench portions 40. In the second region 74, the number of gate trench portions 40 provided in the arrangement direction is less than or equal to the number of dummy trench portions 30. In the example of FIG. 7, the ratio of the number of gate trench portions 40 to the number of dummy trench portions 30 in the second region 74 is 1 to 2.

Since there are a greater number of gate trench portions 40 in the first region 72 than in the second region 74, it is possible to implant many holes generated from the back surface. On the other hand, in the second region 74, electrons can be implanted into the drift region 18 from the emitter regions 12 provided in the gate trench portions 40. Therefore, at the boundary region between the first region 72 and the second region 74, extraction of the holes of the first region 72 and the second region 74 becomes easier due to the electrons implanted in the drift region 18 in the second region 74. Due to this, it is possible to lower the hole density in the boundary region between the first region 72 and the second region 74.

As shown in FIG. 2, the first region 72 may have a full gate structure or may include dummy trench portions 30. In a case where the first region 72 includes dummy trench portions 30, the density of the dummy trench portions 30 in the first region 72 is less than the density of the dummy trench portions 30 in the second region 74. By arranging the dummy trench portions 30 in the first region 72, it is possible to encourage the extraction of holes inside the first region 72 as well.

Figure 8:
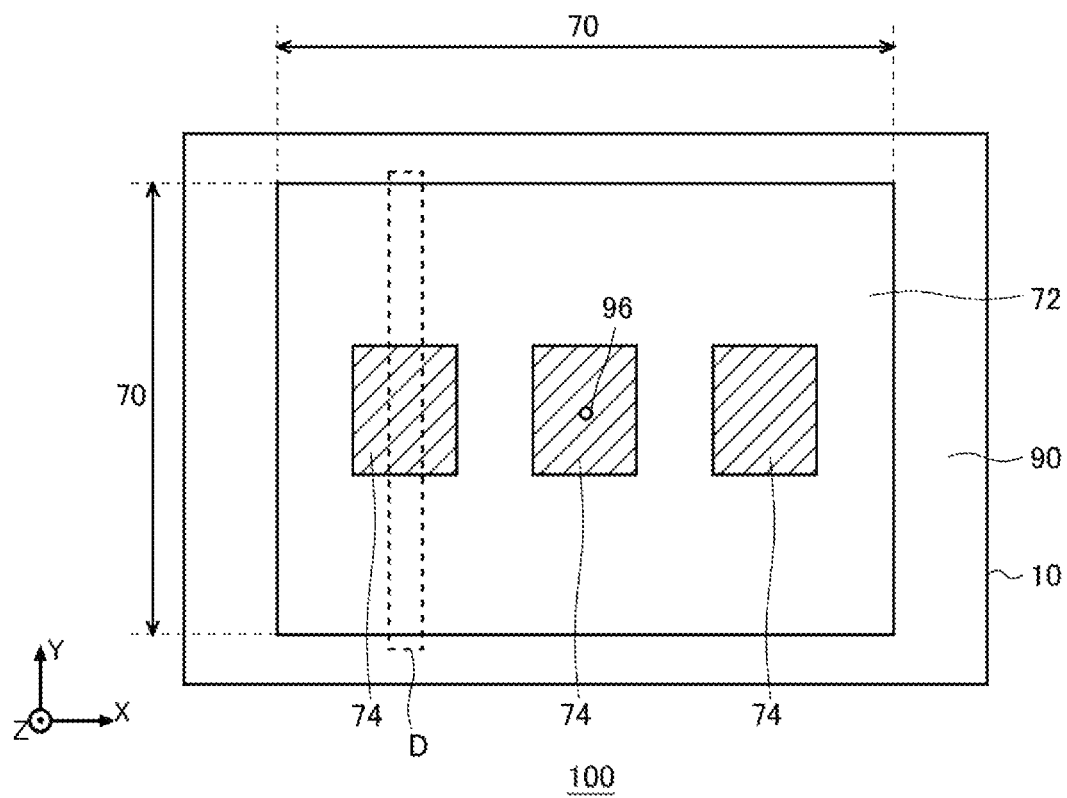
FIG. 8 shows another arrangement example of the first regions 72 and the second regions 74.

FIG. 8 shows another arrangement example of the first regions 72 and the second regions 74. In the present example, a second region 74 is arranged in a center 96 of the transistor portion 70 in the top surface view. The center 96 of the transistor portion 70 refers to the center in both the X-axis direction and the Y-axis direction. The center of the transistor portion 70 in the X-axis direction may be the center of a region in the transistor portion 70 sandwiched by trench portions arranged at respective ends thereof in the X-axis direction. The center of the transistor portion 70 in the Y-axis direction may be the center of a region in the transistor portion 70 sandwiched by emitter regions 12 arranged at respective ends thereof in the Y-axis direction.

The center position of the semiconductor substrate 10 may be the center 96 of the transistor portion 70.

At the center 96 of the transistor portion 70, it is easy for holes to flow in from the surrounding regions as well, and therefore it is easier for holes to be accumulated below the accumulation region 16 than in other regions. In the semiconductor device 100 of the present example, a second region 74 is arranged in a region including the center 96 of the transistor portion 70. Therefore, the holes can be efficiently extracted. The second region 74 may be arranged such that the center of the second region 74 matches the center 96 of the transistor portion 70. Furthermore, one second region 74 among a plurality of second regions 74 may be arranged at the center 96 of the transistor portion 70.

The second region 74 arranged at the center 96 of the transistor portion 70 may be surrounded by first regions 72 in the top surface view. In the present embodiment, each of the plurality of second regions 74 is surrounded by first regions 72.

Figure 9:
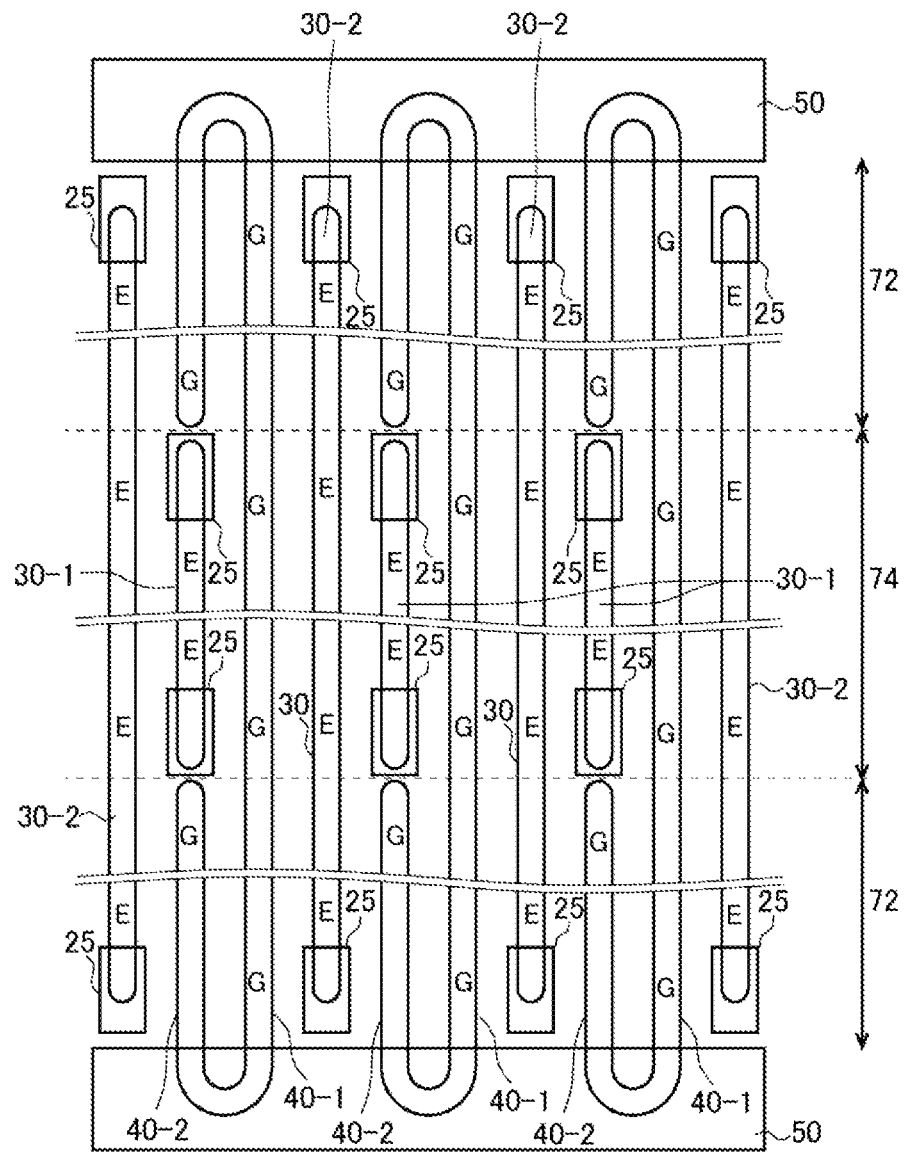
FIG. 9 is an enlarged view of the region D in FIG. 8.

FIG. 9 is an enlarged view of the region D in FIG. 8. In FIG. 9, the doping regions such as the emitter region 12 are omitted. The region D is a region including two first regions 72 and a second region 74 sandwiched by the first regions 72. In the region D, the first regions 72 and the second region 74 are arranged in the Y-axis direction.

The two first regions 72 are arranged at the respective ends of the transistor portion 70 in the Y-axis direction. Furthermore, the semiconductor device 100 includes a gate wire 50 arranged surrounding the transistor portion 70 in the top surface view. For example, the gate wire 50 is a metal layer provided above the top surface of the semiconductor substrate 10. The gate wire 50 and the semiconductor substrate 10 are insulated from each other by an insulating film such as the interlayer dielectric film 38, the gate insulating film 42, and the like.

The transistor portion 70 of the present example includes a gate trench portion 40-1 and a gate trench portion 40-2. The gate trench portion 40-1 is provided continuously in the Y-axis direction through the second region 74, from one first region 72 to the other first region 72.

The gate trench portion 40-2 is provided with two first regions 72, but is not provided with a second region 74. The gate trench portions 40-2 in the respective first regions 72 are arranged at the same position in the X-axis direction. In other words, the gate trench portion 40-2 arranged in one first region 72 and the gate trench portion 40-2 arranged in the other first region 72 are arranged facing each other in the Y-axis direction.

A dummy trench portion 30-1 is arranged between the gate trench portions 40-2 of the respective first regions 72. The dummy trench portion 30-1 is arranged at the same position as the gate trench portions 40-2 in the X-axis direction. However, the dummy trench portion 30-1 and the gate trench portions 40-2 are arranged distanced from each other in the Y-axis direction. With such a configuration, it is possible to easily change the ratio of gate trench portions 40 and dummy trench portions 30 between the first regions 72 and the second regions 74 arranged in the Y-axis direction.

The transistor portion 70 of the present example further includes dummy trench portions 30-2. The dummy trench portions 30-2 are provided continuously in the Y-axis direction through the second region 74, from one first region 72 to the other first region 72. By providing the dummy trench portions 30-2, it is possible to easily adjust the density of the dummy trench portions 30-2 in the entire transistor portion 70.

In the present example, the gate trench portion 40-1 and the gate trench portion 40-2 are arranged adjacent to each other in the X-axis direction. The gate trench portion 40-1 and the gate trench portion 40-2 extend in the Y-axis direction from the first region 72 to the bottom of the gate wire 50, and are electrically connected to the gate wire 50. The insulating film between the gate trench portions 40 and the gate wire 50 is provided with contact holes for connecting the gate trench portions 40 to the gate wire 50. The gate trench portion 40-1 and the gate trench portion 40-2 are connected to each other below the gate wire 50. Two gate trench portions 40 may be connected by a connection portion that is shaped as a curve in the top surface view. By providing the curved connection portion, it is possible to relax the electric field concentration at the Y-axis-direction end portions of the gate trench portions 40.

A conductive polysilicon layer provided above the top surface of the semiconductor substrate 10 can also be provided inside a portion of the insulating film between the semiconductor substrate 10 and the gate wire 50. The semiconductor substrate 10 and the conductive polysilicon layer are insulated from each other by an insulating film such as an oxide film. However, the conductive polysilicon layer and the gate conducting portion 44 are electrically connected to each other by a contact hole or the like provided in the insulating film. An insulating film such as the interlayer dielectric film 38 may be provided between the conductive polysilicon layer and the gate wire 50. However, the conductive polysilicon layer and the gate wire 50 are electrically connected to each other by a contact hole or the like provided in the insulating film The dummy trench portion 30-2 is arranged extending in the Y-axis direction, in a range that does not overlap with the gate wire 50. The dummy trench portion 30-1 and the dummy trench portion 30-2 are electrically connected to the emitter electrode 52 via a connecting portion 25. A connecting portion 25 may be arranged at both Y-axis-direction ends of each dummy trench portion 30.

As an example, the connecting portion 25 is a conductive polysilicon layer provided above the top surface of the semiconductor substrate 10. The connecting portion 25 and the semiconductor substrate 10 are insulated from each other by an insulating film such as an oxide film. However, the connecting portion 25 and the dummy conducting portion 34 are electrically connected by a contact hole or the like provided in the insulating film. An insulating film such as the interlayer dielectric film 38 may be provided between the connecting portion 25 and the emitter electrode 52. However, the connecting portion 25 and the emitter electrode 52 are electrically connected by a contact hole or the like provided in the insulating film.

In the example of FIG. 9, dummy trench portions 30-2, gate trench portions 40-2, and gate trench portions 40-1 are arranged in a repeating manner in the X-axis direction in the first region 72. Dummy trench portions 30-2, dummy trench portions 30-1, and gate trench portions 40-1 are arranged in a repeating manner in the X-axis direction in the second region 74. In other words, in the example of FIG. 9, the ratio of dummy trench portions 30 to gate trench portions 40 is 1 to 2 in the first region 72, and the ratio of dummy trench portions 30 to gate trench portions 40 is 2 to 1 in the second region 74. As described above, the dummy trench portions 30-2 are arranged continuously in the first region 72 and the second region 74. Furthermore, the gate trench portions 40-1 are arranged continuously in the first region 72 and the second region 74.

Figure 10:
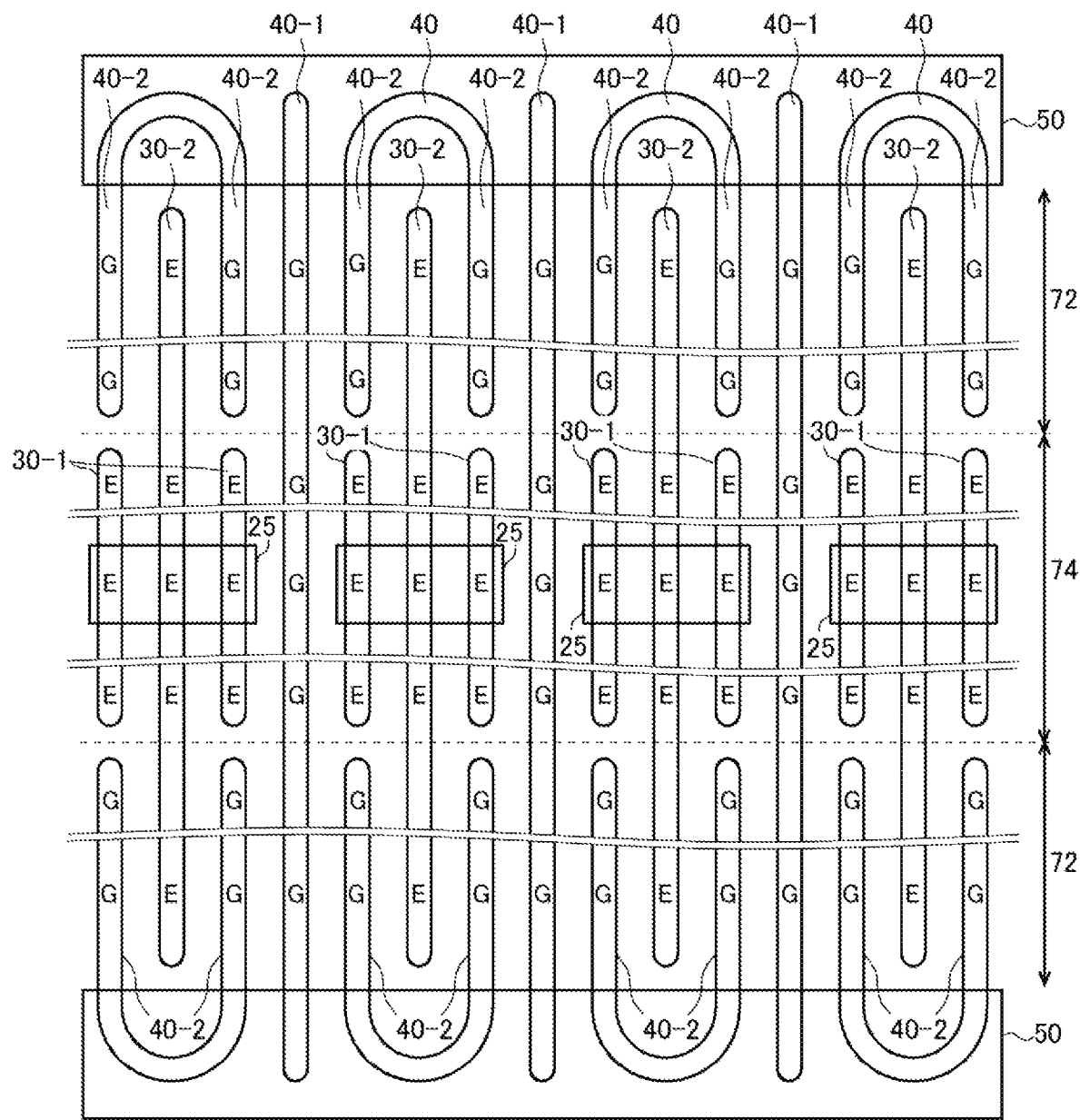
FIG. 10 shows another example of the region D in FIG. 8.

FIG. 10 shows another example of the region D in FIG. 8. In FIG. 10, the doping regions such as the emitter region 12 are omitted. In the first region 72 of the present example, the dummy trench portion 30-2 is arranged between gate trench portions 40-2 in the X-axis direction. As described above, the dummy trench portion 30-2 is provided continuously to the first region 72 and the second region 74. The gate trench portions 40-2 terminate within the region of the first region 72.

In the present example, the two gate trench portions 40-2 sandwiching the dummy trench portion 30-2 are connected by the curved connection portion below the gate wire 50. Furthermore, the gate trench portion 40-1 is arranged on the side of the gate trench portion 40-2 opposite the dummy trench portion 30-2. As described above, the gate trench portion 40-1 is provided continuously to the first region 72 and the second region 74.

Sets of a gate trench portion 40-2, a dummy trench portion 30-2, a gate trench portion 40-2, and a gate trench portion 40-1 are arranged repeating in the X-axis direction in the first region 72 of the present example. The ratio of dummy trench portions 30 to gate trench portions 40 is 1 to 3 in the first region 72.

Sets of a dummy trench portion 30-1, a dummy trench portion 30-2, a dummy trench portion 30-1, and a gate trench portion 40-1 are arranged repeating in the X-axis direction in the second region 74 of the present example. As described above, the dummy trench portions 30-1 of the second region 74 are arranged sandwiched between gate trench portions 40-2 of the first regions 72. The dummy trench portions 30-2 are arranged continuously in the first regions 72 and the second region 74. Furthermore, the gate trench portions 40-1 are arranged continuously in the first regions 72 and the second regions 74. The ratio of dummy trench portions 30 to gate trench portions 40 is 3 to 1 in the second region 74. In a case where the dummy trench portions 30 are arranged continuously in the X-axis direction, each connecting portion 25 may be provided spanning a plurality of dummy trench portions 30 such as shown in FIG. 10, or a connecting portion 25 may be provided for each dummy trench portion 30 such as shown in FIG. 9.

In this way, by using the dummy trench portions 30-1 and dummy trench portions 30-2 as well as the gate trench portions 40-1 and gate trench portions 40-2, it is possible to easily adjust the ratio of dummy trench portions 30 to gate trench portions 40 in the first regions 72 and second regions 74 arranged in the Y-axis direction. Furthermore, the gate trench portions 40 can be easily connected to the respective gate wires 50.

Figure 11:
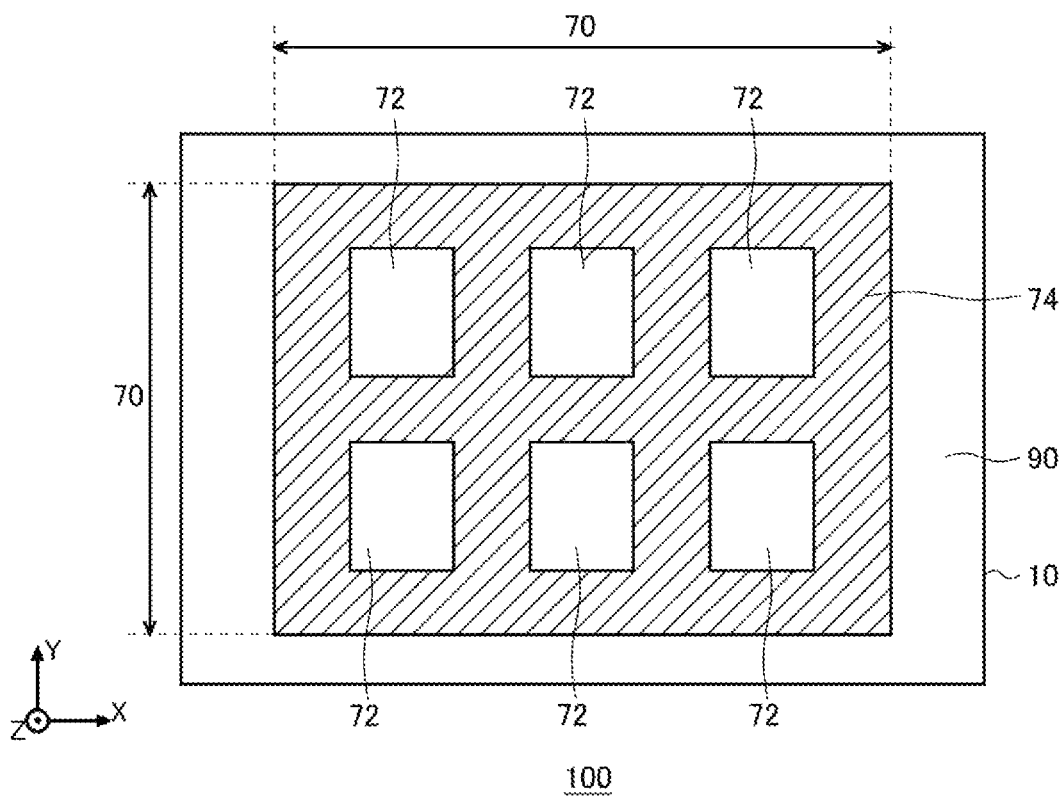
FIG. 11 shows another arrangement example of the first regions 72 and the second regions 74.

FIG. 11 shows another arrangement example of the first regions 72 and the second regions 74. In the present example, the positions of the first regions 72 and the second regions 74 shown in FIG. 1 are reversed. In other words, a plurality of the first regions 72 are arranged in a divided manner and each first region 72 is surrounded by the second region 74. Furthermore, the second region 74 is arranged at the end portions of the transistor portion 70. With such an arrangement as well, extraction of the holes in the first regions 72 from the second region 74 becomes easier.

Figure 12:
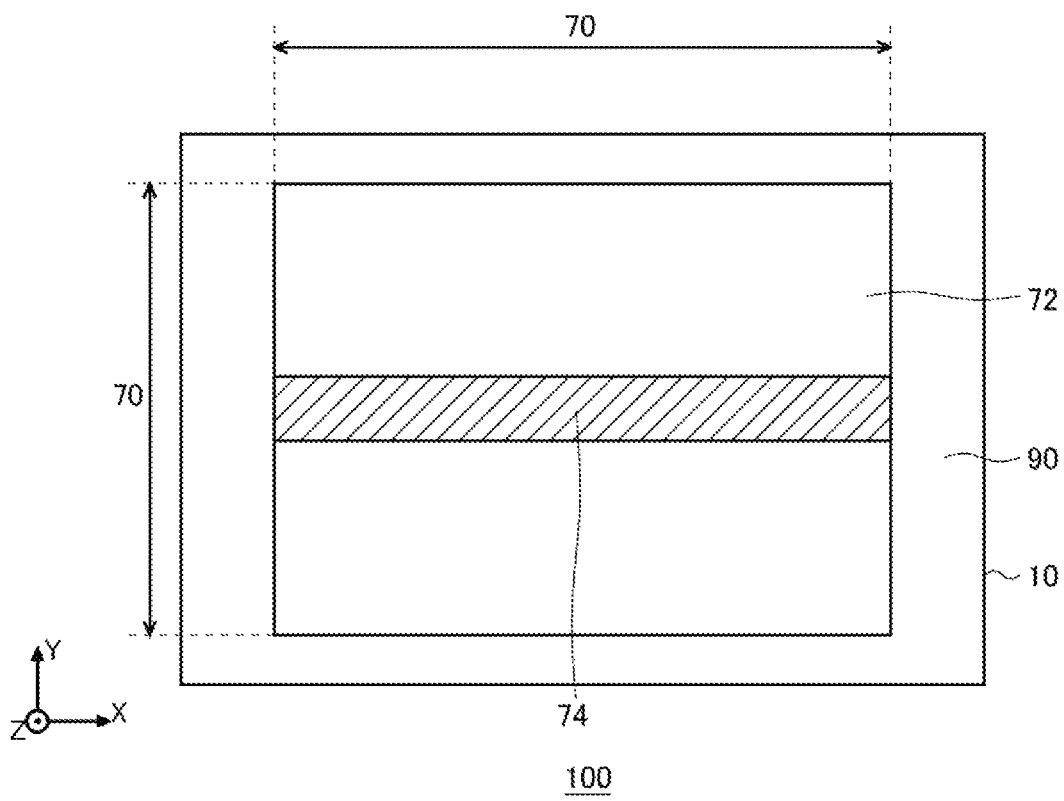
FIG. 12 shows another arrangement example of the first regions 72 and the second regions 74.

FIG. 12 shows another arrangement example of the first regions 72 and the second regions 74. In the present example, the second region 74 is arranged crossing the transistor portion 70 in the X-axis direction. In other words, the second region 74 is arranged extending in a direction intersecting with the trench portions. Furthermore, the second region 74 is arranged sandwiched by first regions 72 in the Y-axis direction. With such an arrangement, the second region 74 can be arranged for each mesa portion 60 extending in the Y-axis direction. Therefore, extraction of the holes of each mesa portion 60 can be made easier.

In the example of FIG. 12, an example is shown in which one second region 74 is arranged in the transistor portion 70, but the transistor portion 70 may include a plurality of the second regions 74. In such a case, the second regions 74 may be arranged at prescribed intervals in the Y-axis direction.

Figure 13:
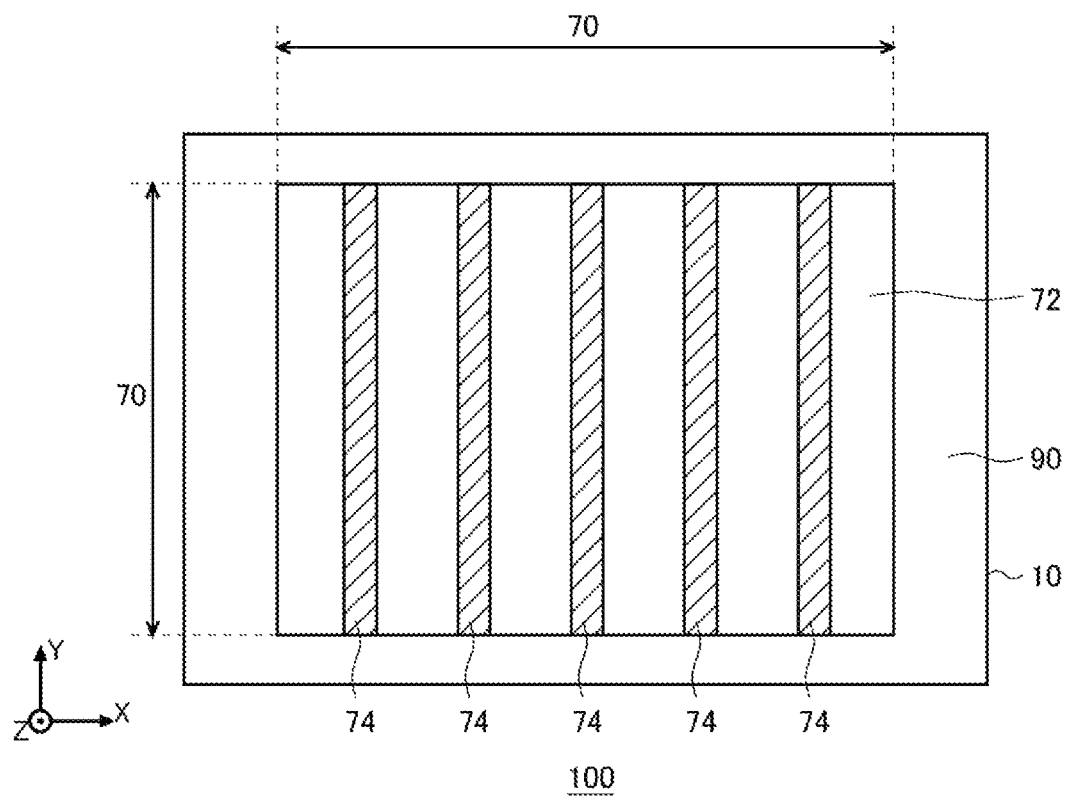
FIG. 13 shows another arrangement example of the first regions 72 and the second regions 74.

FIG. 13 shows another arrangement example of the first regions 72 and the second regions 74. In the present example, the second regions 74 are arranged crossing the transistor portion 70 in the Y-axis direction. In other words, the second regions 74 are arranged extending in a direction parallel to the trench portions. Furthermore, each second region 74 is arranged sandwiched between first regions 72 in the X-axis direction. In the present example, the dummy trench portions 30 and gate trench portions 40 do not need to be arranged in the Y-axis direction, such as the dummy trench portions 30-1 and the gate trench portions 40-2 shown in FIG. 9 or 10 are. Therefore, it becomes easy to form the trench portions.

Figure 14:
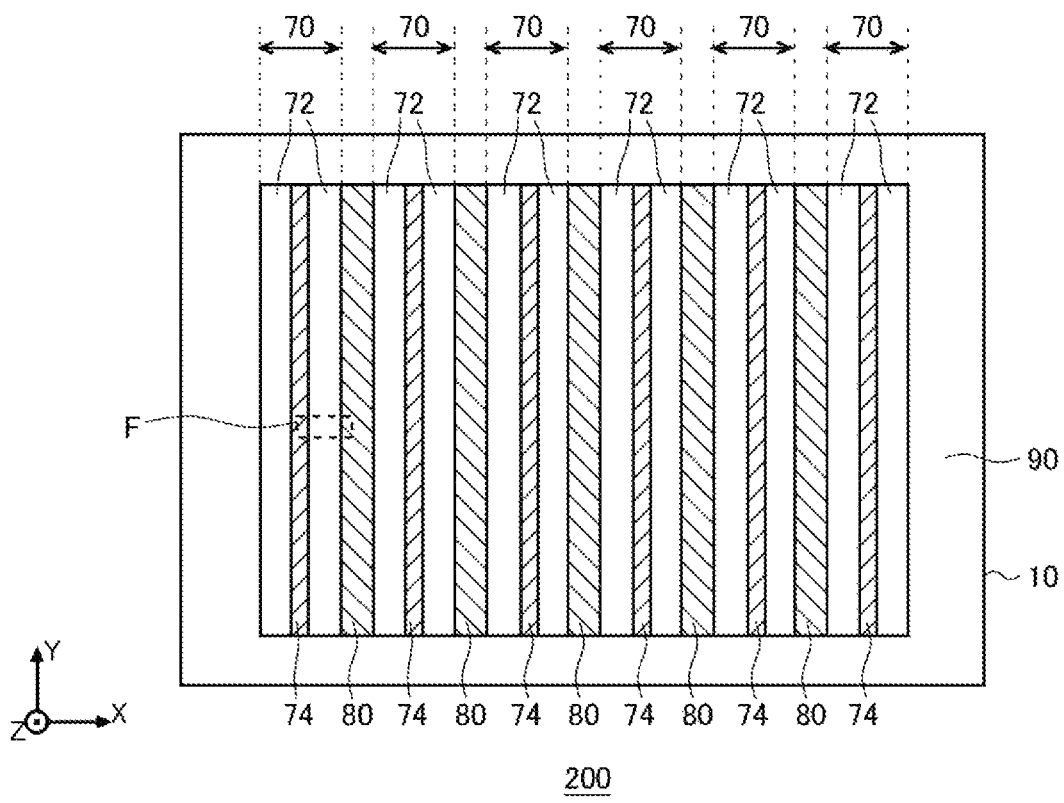
FIG. 14 is a top surface view of an example of a semiconductor device 200 according to another embodiment of the present invention.

FIG. 14 is a top surface view of an example of a semiconductor device 200 according to another embodiment of the present invention. The semiconductor device 200 differs from the semiconductor device 100 by further including a diode portion 80 in addition to the transistor portion 70. The configuration of the semiconductor device 200 other than the diode portion 80 may be the same as that of the semiconductor device 100.

Transistor portions 70 and diode portions 80 are arranged in an alternating manner in the X-axis direction. Each transistor portion 70 and the diode portion 80 may have a rectangular shape that is long in the Y-axis direction, in the top surface view.

At least one transistor portion 70 includes a first region 72 and a second region 74. In the present example, all of the transistor portions 70 include a first region 72 and a second region 74. The arrangement of the first region 72 and the second region 74 in each transistor portion 70 may be similar to that of the transistor portion 70 according to any one of the aspects described in FIGS. 1 to 13. In each transistor portion 70 in FIG. 14, the second region 74 is arranged crossing the transistor portion 70 in the Y-axis direction. The second region 74 may be arranged in the center in the X-axis direction in each transistor portion 70.

Figure 15:
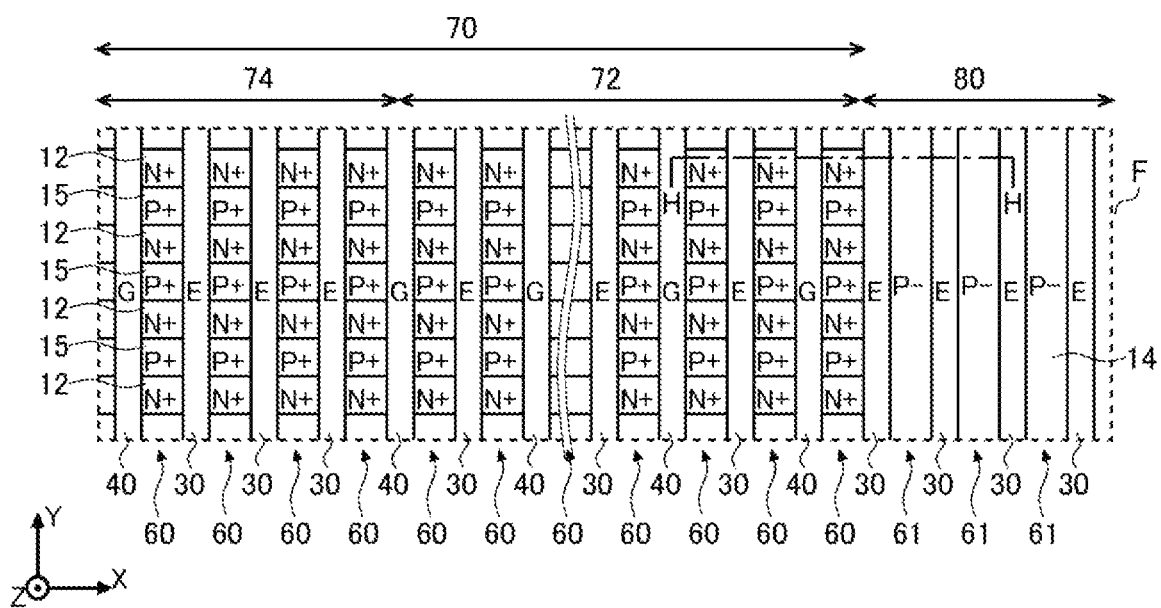
FIG. 15 is a top surface view of the region F in FIG. 14.

FIG. 15 is a top surface view of the region F in FIG. 14. The region F includes a transistor portion 70 and a diode portion 80. The structure of the transistor portion 70 is similar to that of the transistor portion 70 according to any one of the aspects described in FIGS. 1 to 14.

In the diode portion 80, a plurality of dummy trench portions 30 are provided extending in a predetermined extension direction in the top surface of the semiconductor substrate 10. The emitter region 12 does not need to be provided in a mesa portion 61 in the diode portion 80. The area of the P type region exposed in the top surface is greater in the mesa portion 61 of the present example than in the mesa portion 60 of the transistor portion 70. The base region 14 may be exposed in the top surface of the mesa portion 61. In the mesa portion 61, the base region 14 may be provided at a position in the Y-axis direction where the emitter region 12 and the contact region 15 are provided in the mesa portion 60.

Figure 16:
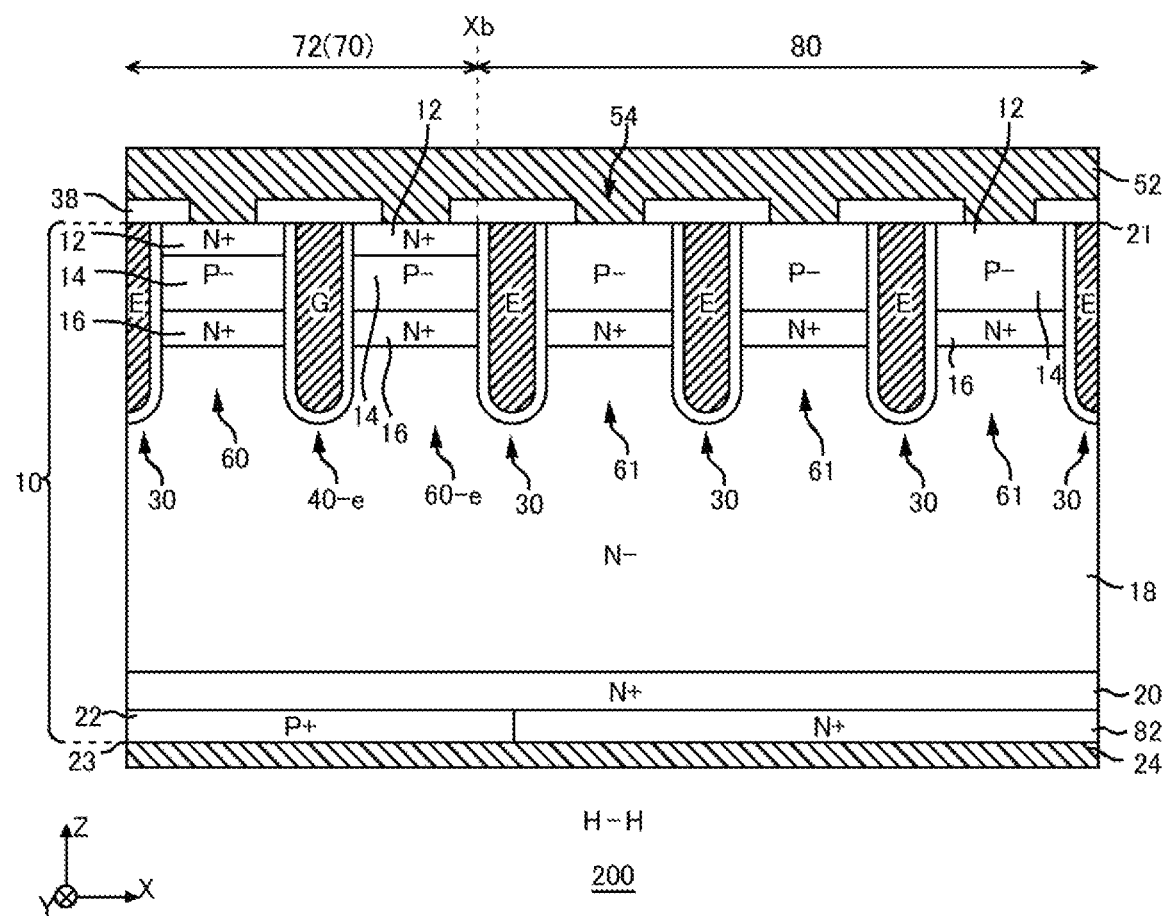
FIG. 16 shows an example of the H-H cross section in FIG. 15.

FIG. 16 shows an example of the H-H cross section in FIG. 15. The H-H cross section of the present example is the XZ-plane spanning the transistor portion 70 and the diode portion 80, and is a cross section that passes through the emitter region 12 of the transistor portion 70. The cross-sectional structure of the transistor portion 70 is similar to that of the transistor portion 70 described in FIG. 3.

The diode portion 80 includes the semiconductor substrate 10, the interlayer dielectric film 38, the emitter electrode 52, and the collector electrode 24 in this cross section. An N– type drift region 18 is provided in the semiconductor substrate 10.

A P– type base region 14 is provided between the top surface 21 of the semiconductor substrate 10 and the drift region 18. In the diode portion 80 of the present example, the base region 14 is provided until becoming exposed in the top surface 21 of the semiconductor substrate 10, but the emitter region 12 is not provided. Furthermore, FIG. 16 shows an example in which an accumulation region 16 is provided in each mesa portion 61 of the diode portion 80, but an accumulation region 16 does not need to be provided in each mesa portion 61 of the diode portion 80.

In the diode portion 80, a plurality of dummy trench portions 30 are arranged continuously in the X-axis direction. Gate trench portions 40 do not need to be provided in the diode portion 80. The structures and sizes of the dummy trench portions 30 in the diode portion 80 may be the same as those of the dummy trench portions 30 in the transistor portion 70. The intervals between the trench portions in the diode portion 80 may be the same as or different from the intervals between the trench portions in the transistor portion 70.

In the diode portion 80, a cathode region 82 is provided between the drift region 18 and the bottom surface 23 of the semiconductor substrate 10. The cathode region 82 of the present example is provided between the buffer region 20 and the bottom surface 23 of the semiconductor substrate 10. The cathode region 82 is a region of the first conductivity type that has a higher doping concentration than the drift region 18. The cathode region 82 of the present example is N+ type. The cathode region 82 is electrically connected to the collector electrode 24.

In the present example, the boundary position between the transistor portion 70 and the diode portion 80 in the X-axis direction is set as the position Xb. Furthermore, the gate trench portion 40 provided at the farthest end in the X-axis direction in the transistor portion 70 is set as the gate trench portion 40-*e*. Yet further, the mesa portion 60 that is in contact with the gate trench portion 40-*e* and arranged closer to the diode portion 80 than the gate trench portion 40-*e* is set as the mesa portion 60-*e*. The position Xb in the present example is an end portion on a side of the mesa portion 60-*e* opposite the gate trench portion 40-*e*.

The transistor portion 70 may include the first region 72 at the boundary thereof with the diode portion 80 (that is, at a position contacting the position Xb). The holes of the mesa portion 60 in the vicinity of the boundary with the diode portion 80 can be extracted from the diode portion 80 when the transistor portion 70 is turned ON. Therefore, by arranging the first region 72 at the boundary with the diode portion 80, it is possible to improve the carrier accumulation effect and the channel density and also to improve the extractability of the holes from the first region 72.

As shown in FIG. 14, a second region 74 may be arranged in the center in the X-axis direction in each transistor portion 70. In this way, it is possible to efficiently extract the holes from a first region 72 sandwiched by a second region 74 and a diode portion 80.

Figure 17:
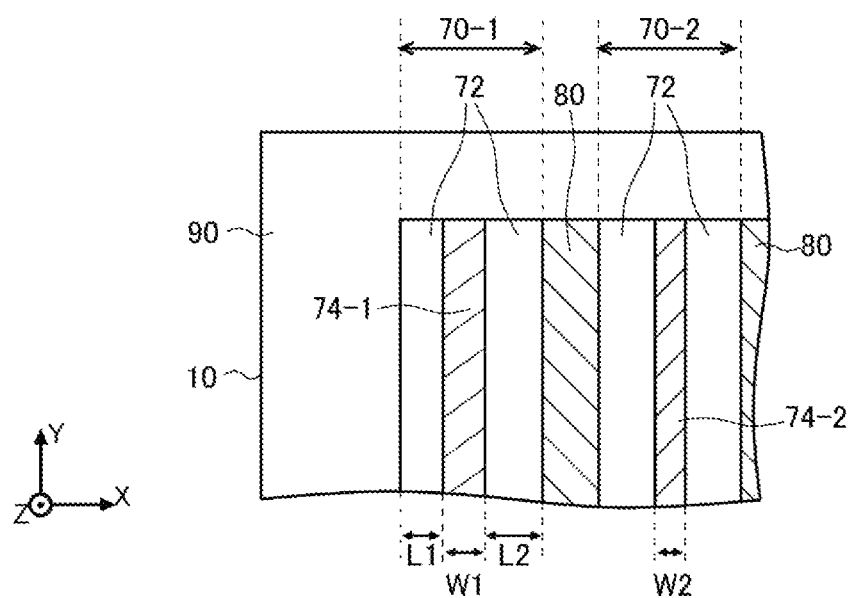
FIG. 17 shows an arrangement example of the first regions 72 and the second regions 74 in transistor portions 70.

FIG. 17 shows an arrangement example of the first regions 72 and the second regions 74 in transistor portions 70. FIG. 17 shows an enlarged view of a portion near the end portion of the semiconductor substrate 10. In the present example, at least one transistor portion 70 is not sandwiched by two diode portions 80 in the X-axis direction. For example, as shown in FIG. 17, the transistor portion 70-1 in contact with an edge region 90 in the X-axis direction is sandwiched by the edge region 90 and a diode portion 80. Furthermore, at least one transistor portion 70 is sandwiched between two diode portions 80 in the X-axis direction. For example, as shown in FIG. 17, the transistor portion 70-2 arranged distanced from the edge region 90 in the X-axis direction is sandwiched by two diode portions 80. The emitter electrode 52 is not provided above the edge region 90 of the present example. Therefore, holes are not extracted from the edge region 90.

In the present example, the second region 74-1 in the transistor portion 70-1 has a greater width in the X-axis direction than the second region 74-2 in the transistor portion 70-2. In other words, the width W1 of the second region 74-1 is greater than the width W2 of the second region 74-2. The width W1 may be greater than or equal to 1.2 times the width W2, or may be greater than or equal to 1.5 times the width W2. Since a diode portion 80 is arranged only on one side of the transistor portion 70-1 in the X-axis direction, the amount of holes extracted by the diode portions 80 is reduced. In contrast to this, by making the width of the second region 74-1 greater than that of the second region 74-2, it is possible to improve the hole extraction amount in the transistor portion 70-1.

Furthermore, the position of the second region 74-1 in the X-axis direction in the transistor portion 70-1 may be shifted toward the edge region 90 side from the center of the transistor portion 70-1. In other words, with a distance between the edge region 90 and the second region 74-1 in the X-axis direction being L1 and a distance between the diode portion 80 and the second region 74-1 in the X-axis direction being L2, the distance L1 is less than the distance L2. In this way, it is possible to efficiently extract the holes of the first region 72 in contact with the edge region 90.

Figure 18:
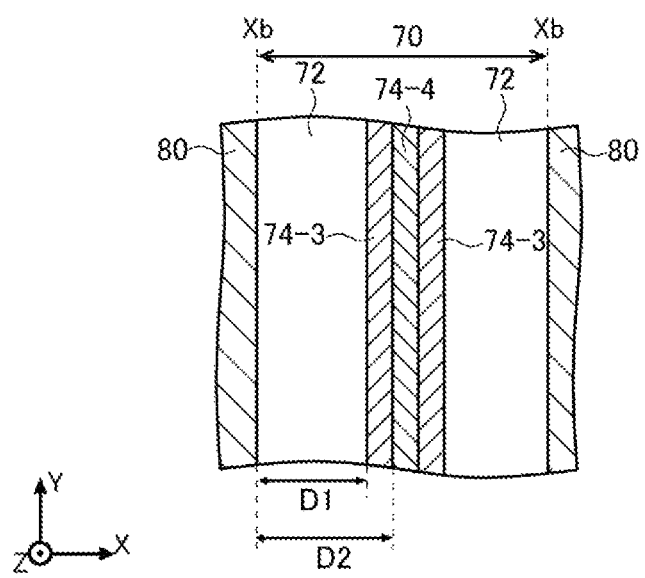
FIG. 18 shows another arrangement example of the first regions 72 and the second regions 74 in the transistor portion 70.

FIG. 18 shows another arrangement example of the first regions 72 and the second regions 74 in the transistor portion 70. In the transistor portion 70 of the present example, the ratio of the number of dummy trench portions 30 to the number of gate trench portions 40 (sometimes referred to as the dummy ratio in this Specification) becomes greater in regions where the distance D from the diode portion 80 in the X-axis direction is greater. It should be noted that, in regions where the dummy ratio is smaller, the number of gate trench portions 40 is greater and the channel density is higher.

As an example, the transistor portion 70 includes a second region 74-3 and a second region 74-4 having a greater dummy ratio than the second region 74-3. In the X-axis direction, the distance D2 from the diode portion 80 to the second region 74-4 is greater than the distance D1 from the diode portion 80 to the second region 74-3. For example, the second region 74-4 is arranged in the center of the transistor portion 70 in the X-axis direction. A second region 74-3 may be arranged in contact with each side of the second region 74-4 in the X-axis direction. The second regions 74-3 include gate trench portions 40. The second region 74-4 may include a gate trench portion 40.

With such a configuration, it is possible to efficiently extract holes in a region distanced from the diode portion 80 as well. In the example of FIG. 18, an example is shown in which the dummy ratios of the second regions 74 change in two stages, as shown by the second region 74-3 and the second region 74-4, but the dummy ratio of the second regions 74 may change in a greater number of stages.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

EXPLANATION OF REFERENCES

10: semiconductor substrate, 12: emitter region, 14: base region, 15: contact region, 16: accumulation region, 17: under region, 18: drift region, 20: buffer region, 21: top surface, 22: collector region, 23: bottom surface, 24: collector electrode, 25: connecting portion, 30: dummy trench portion, 32: dummy insulating film, 34: dummy conducting portion, 38: interlayer dielectric film, 40: gate trench portion, 42: gate insulating film, 44: gate conducting portion, 50: gate wire, 52: emitter electrode, 54: contact hole, 60: mesa portion, 61: mesa portion, 70: transistor portion, 72: first region, 74: second region, 80: diode portion, 82: cathode region, 90: edge region, 96: center, 100: semiconductor device, 200: semiconductor device

What is claimed is:

1. A semiconductor device comprising a semiconductor substrate provided with a transistor portion, wherein
the semiconductor substrate includes, in the transistor portion:
a drift region of a first conductivity type;
an accumulation region of the first conductivity type that is provided between the drift region and a top surface of the semiconductor substrate and has a higher doping concentration than the drift region;
a collector region of a second conductivity type that is provided between a bottom surface of the semiconductor substrate and the drift region; and
a plurality of gate trench portions and a plurality of dummy trench portions that are provided from the top surface of the semiconductor substrate to a position deeper than the accumulation region, the plurality of gate trench portions and the plurality of dummy trench portions extending in a predetermined extension direction in the top surface of the semiconductor substrate and arranged in an arrangement direction orthogonal to the extension direction,
the transistor portion includes:
a first region that includes a gate trench portion; and
a second region in which the number of dummy trench portions arranged in a unit length in the arrangement direction is greater than in the first region, and
the second region is arranged sandwiched by first regions, each first region being the first region, in the extension direction.

2. The semiconductor device according to claim 1, wherein
the second region is arranged in a center of the transistor portion in the arrangement direction.

3. The semiconductor device according to claim 1, wherein
the first region includes a plurality of gate trench portions, each gate trench portion being the gate trench portion, arranged continuously in the arrangement direction, but does not include the dummy trench portion.

4. The semiconductor device according to claim 1, wherein
the second region includes both the dummy trench portion and the gate trench portion.

5. The semiconductor device according to claim 1, wherein
the first region and the second region are arranged side by side in the arrangement direction.

6. The semiconductor device according to claim 1, wherein
the first region and the second region are arranged side by side in the extension direction.

7. A semiconductor device comprising a semiconductor substrate provided with a transistor portion, wherein
the semiconductor substrate includes, in the transistor portion:
a drift region of a first conductivity type;
an accumulation region of the first conductivity type that is provided between the drift region and a top surface of the semiconductor substrate and has a higher doping concentration than the drift region;
a collector region of a second conductivity type that is provided between a bottom surface of the semiconductor substrate and the drift region; and
a plurality of gate trench portions and a plurality of dummy trench portions that are provided from the top surface of the semiconductor substrate to a position deeper than the accumulation region, the plurality of gate trench portions and the plurality of dummy trench portions extending in a predetermined extension direction in the top surface of the semiconductor substrate and arranged in an arrangement direction orthogonal to the extension direction,
the transistor portion includes:
a first region that includes a gate trench portion; and
a second region in which the number of dummy trench portions arranged in a unit length in the arrangement direction is greater than in the first region,
the semiconductor substrate is further provided with a diode portion,
a plurality of transistor portions, each transistor portion being the transistor portion, and a plurality of diode portions, each diode portion being the diode portion, are arranged in an alternating manner in the arrangement direction,
at least one of the transistor portions is not sandwiched by the diode portions in the arrangement direction,
at least one of the transistor portions is sandwiched by the diode portions in the arrangement direction, and
the second region of the transistor portion that is not sandwiched by the diode portions has a greater width in the arrangement direction than the second region of the transistor portion that is sandwiched by the diode portions.

8. A semiconductor device comprising a semiconductor substrate provided with a transistor portion, wherein
the semiconductor substrate includes, in the transistor portion:
a drift region of a first conductivity type;
an accumulation region of the first conductivity type that is provided between the drift region and a top surface of the semiconductor substrate and has a higher doping concentration than the drift region;
a collector region of a second conductivity type that is provided between a bottom surface of the semiconductor substrate and the drift region; and a plurality of gate trench portions and a plurality of dummy trench portions that are provided from the top surface of the semiconductor substrate to a position deeper than the accumulation region, the plurality of gate trench portions and the plurality of dummy trench portions extending in a predetermined extension direction in the top surface of the semiconductor substrate and arranged in an arrangement direction orthogonal to the extension direction, the transistor portion includes:
a first region that includes a gate trench portion; and
a second region in which the number of dummy trench portions arranged in a unit length in the arrangement direction is greater than in the first region, the semiconductor substrate is further provided with a diode portion, a plurality of transistor portions, each transistor portion being the transistor portion, and a plurality of diode portions, each diode portion being the diode portion, are arranged in an alternating manner in the arrangement direction, and in the transistor portions, regions where a distance from the diode portions in the arrangement direction is greater have a higher ratio of the number of dummy trench portions to the number of gate trench portions.

9. The semiconductor device according to claim 1, wherein
the second region is arranged sandwiched by the first regions also in the arrangement direction.

10. The semiconductor device according to claim 1, wherein
the first region is arranged sandwiched by second regions, each second region being the second region, in both the extension direction and the arrangement direction.

11. The semiconductor device according to claim 1, wherein
the first region is arranged sandwiched by second regions, each second region being the second region, in the extension direction.

12. The semiconductor device according to claim 1, wherein
the first regions and second regions, each second region being the second region, are arranged in an alternating manner in the extension direction.

13. The semiconductor device according to claim 1, wherein
the second region is surrounded by the first region in a top surface view.

14. The semiconductor device according to claim 1, wherein
the first region is surrounded by the second region in a top surface view.

15. The semiconductor device according to claim 1, wherein
the plurality of gate trench portions and the plurality of dummy trench portions are provided continuously in the extension direction from one of the first regions to another of the first regions through the second region.

* * * * *